United States Patent [19]

Araki et al.

[11] 4,445,133

[45] Apr. 24, 1984

[54] SEMICONDUCTOR DEVICE

[75] Inventors: Youichi Araki; Toshio Ogawa, both of Kawasaki, Japan

[73] Assignee: Tokyo Shibaura Denki Kabushiki Kaisha, Kawasaki, Japan

[21] Appl. No.: 294,750

[22] Filed: Aug. 20, 1981

[30] Foreign Application Priority Data

Aug. 22, 1980 [JP] Japan .................. 55-115391

[51] Int. Cl.³ .................... H01L 29/74; H01L 27/02; H01L 23/48
[52] U.S. Cl. .......................... 357/38; 357/51; 357/68; 357/86
[58] Field of Search ............ 357/38, 51, 68, 86

[56] References Cited

U.S. PATENT DOCUMENTS

| | | | |
|---|---|---|---|
| 2,980,832 | 4/1961 | Stein et al. | 357/68 |
| 3,486,088 | 12/1969 | Gray et al. | 357/68 |
| 3,579,060 | 5/1971 | Davis | 357/38 |
| 3,622,845 | 11/1971 | McIntyre et al. | 357/38 |
| 4,086,612 | 4/1978 | Voss | 357/38 |
| 4,315,274 | 2/1982 | Fukui et al. | 357/38 |

FOREIGN PATENT DOCUMENTS

| | | | |
|---|---|---|---|
| 54-22180 | 2/1979 | Japan | 357/38 |
| 1055682 | 1/1967 | United Kingdom | 357/38 |

Primary Examiner—Andrew J. James
Assistant Examiner—John LaMont
Attorney, Agent, or Firm—Finnegan, Henderson, Farabow, Garrett & Dunner

[57] ABSTRACT

Disclosed is a semiconductor device comprising: a semiconductor body having a first semiconductor layer of the N conductivity type, second and third semiconductor layers of the P conductivity type, and first and second regions of the N conductivity type formed in the second semiconductor layer; a cathode electrode having first and second portions formed on the first semiconductor region; a gate electrode provided in the second semiconductor layer in opposition to the cathode electrode with the second semiconductor region interposed therebetween; an anode electrode provided on the third semiconductor layer; an auxiliary electrode consisting of two first portions and one second portion connected at ends respectively to the first portions, said first portions being formed on said second region and having free ends spaced from each other, and said second portion formed on said second layer and extending along the periphery of the first portion of said cathode electrode; and the second portion of the cathode electrode lying between said free ends of the first portions of the auxiliary electrode.

10 Claims, 12 Drawing Figures

F I G. 10
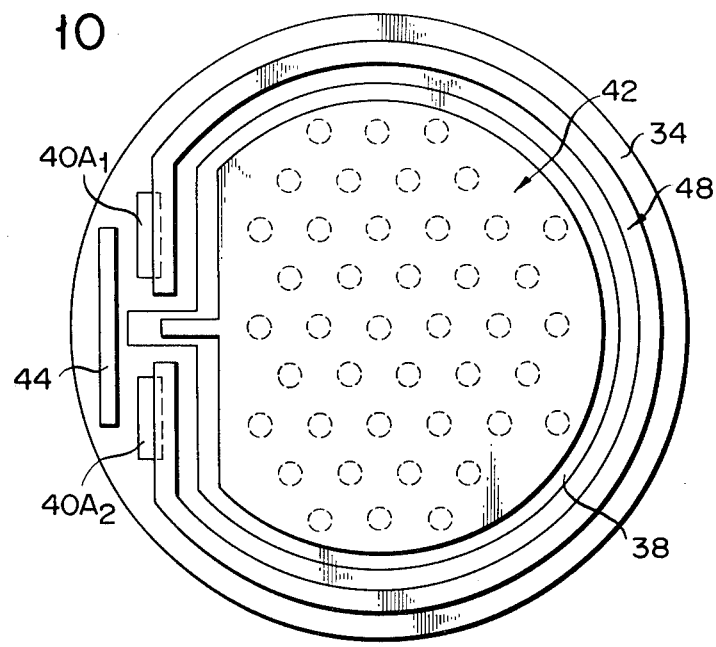
F I G. 11
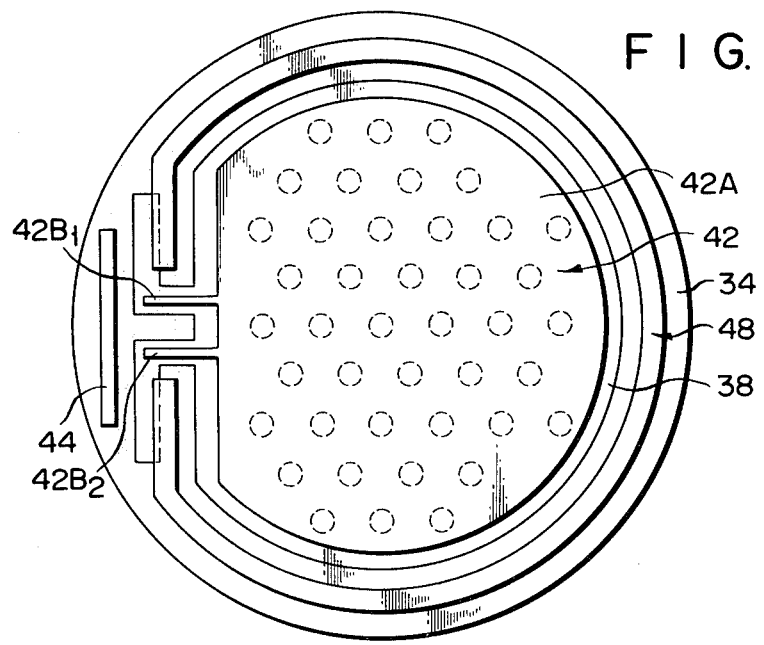

SEMICONDUCTOR DEVICE

BACKGROUND OF THE INVENTION

The present invention relates to a semiconductor device, and more particularly to a power thyristor with a large critical rate of rise of on-state current (di/dt) and free from a finger voltage phenomenon.

It has been known to construct a thyristor with a steep rise characteristic of an ON current and a large critical rate of rise of on-state current (di/dt). Such a prior art thrysitor has a structure as shown in FIGS. 1 and 2, for example. The thyristor shown in those FIGS. is made of a first semiconductor layer 12 of N conductivity type, second and third semiconductor layers 14 and 16 of P conductivity type formed on both major surfaces of the first layer 12, a main emitter region 18 of N conductivity type and an auxiliary emitter region 20 of the same type, both being formed in the second layer 12, a cathode electrode 22 formed on the main emitter region 18, a gate electrode 24 formed on the second semiconductor layer 14, an anode electrode 26 formed on the third semiconductor layer 16, and an auxiliary electrode 28 formed on the second semiconductor layer 14, being disposed along an outer periphery of the cathode electrode 22. The cathode electrode 22 and the N region 18 cooperatively form an emitter section of a main thyristor element, while the auxiliary electrode 28 and the auxiliary emitter region 18 make up an emitter section of an auxiliary thyristor element. The thyristor with such a structure as shown in FIGS. 1 and 2 operates in such a way that a gate current ① flowing through the gate electrode 24 first turns on the auxiliary thyristor, and a turn-on current ② flows into the main thyristor element in the form of a trigger current ③ for the main thyristor element thereby turning on the main thyristor element. Thus, the prior art thyristor makes use of a called amplification gate function. Therefore, the trigger current ③ to the main thyristor element is large, so that an initial turn-on region of the main thyristor element is wide. This provides an abrupt rise of the ON current and a large critical rate of rise of on-state current (di/dt).

In the prior thyristor as shown in FIGS. 1 and 2, the turn-on of the main thyristor element is performed through two steps as described above. In the course of the two-step turn-on process, a finger voltage $V_{fin}$ phenomenon takes place as shown in FIG. 3. The finger voltage phenomenon offers no problem in the use of a single thyristor or when two or more parallel-connected thyristors are turned on with a high voltage applied to between the anode and cathode. However, the finger voltage phenomenon is problematic when two or more parallel-connected thyristors are turned on when a low voltage is applied therebetween.

To further discuss the finger voltage phenomenon, a simple model circuit will be used in which two thyristors $SCR_1$ and $SCR_2$ each having the structure as shown in FIGS. 1 and 2 are inserted between terminals P and Q, being respectively connected at the cathodes to associative resistors, and at the anodes together to an inductance L.

Assume that, in the model, a total current of 6,000 A flows through a P-Q path, and that the current equally shunts into the two thyristors $SCR_1$ and $SCR_2$. On this assumption, 3,000 A current flows into each of the thyristors. Even if trigger currents are concurrently fed to the two thyristors $SCR_1$ and $SCR_2$, only one of the thyristors is turned on when there is non-coincidence between the finger voltages of the thyristors $SCR_1$ and $SCR_2$, so long as the resistances of the resistors $R_1$ and $R_2$ are properly selected allowing for the finger voltages. Assuming that the 3,000 A current flows into the thyristor $SCR_1$, following the turn-on of the thyristor $SCR_1$, a voltage drop $V_{AB}$ as the sum of a voltage drop across the thyristor $SCR_1$ at the time of the 3,000 A current passage through the thyristor $SCR_1$ and a voltage drop across the resistor $R_1$, appears between junction points A and B.

The thyristor $SCR_1$ has a voltage vs. current characteristic as shown in FIG. 3. The voltage drop across the thyristor $SCR_1$ is 1.5 V when the 3,000 A current flows therethrough. The resistance of the resistor $R_1$ is 0.2 mΩ. The voltage drop $V_{AB}$ is $$V_{AB} = 1.5\ V + (3{,}000 \times 2 \times 10^{-4}) = 2.1\ V.$$

Accordingly, to turn on the thyristor $SCR_2$, its finger voltage $V_{fin}$ must be below a difference when the voltage drop across the resistor $R_2$ at the time of the 3,000 A current passage is subtracted from the 2.1 V. The adjustment of the resistances of those resistors $R_1$ and $R_2$ is not only cumbersome, time-consuming, and superfluous but also poor in the accuracy. An approach to use a large resistor for the resistor $R_1$ enables the thyristor $SCR_2$ to turn on reliably even though the finger voltage is relatively large. The approach, however, involves a problem of heat dissipation because of the large heat generated. The turn-on of two or more thyristors in a well-balanced state necessitates that the finger voltage be as small as possible. Nevertheless, the conventional thyristors have been unsuccessful in reducing the finger voltage $V_{fin}$ to a desired degree or a negligible one.

SUMMARY OF THE INVENTION

For the above reason, the present invention has an object to provide a semiconductor device with a remarkably small finger voltage and a large critical rate of rise of on-state current (di/dt).

According to the present invention, there is provided a semiconductor device comprising a semiconductor body having a first semiconductor layer of a first conductivity type, second and third semiconductor layers of a second conductivity type formed contacting with both major surfaces of the first semiconductor layer, and first and second semiconductor regions of the first conductivity type formed in the second layer, a cathode electrode having first and second portions provided on the first region, a gate electrode provided on the second layer, an anode electrode provided on the third layer, an auxiliary electrode consisting of two first portions and one second portion connected at ends respectively to the first portions, said first portions being formed on said second region and having free ends spaced from each other, and said second portion formed on said second layer and extending along the periphery of the first portion of said cathode electrode, and the second portion of the cathode electrode and the first portions of the auxiliary electrode being disposed in an area between the gate electrode and the cathode electrode where a gate current flows.

BRIEF DESCRIPTION OF THE DRAWINGS

FIG. 10 is a plan view of another embodiment of a semiconductor device according to the present invention; and FIG. 11 is a plan view of yet another embodiment of a semiconductor device according to the present invention.

DETAILED DESCRIPTION OF THE PREFERRED EMBODIMENTS

Figure 1:
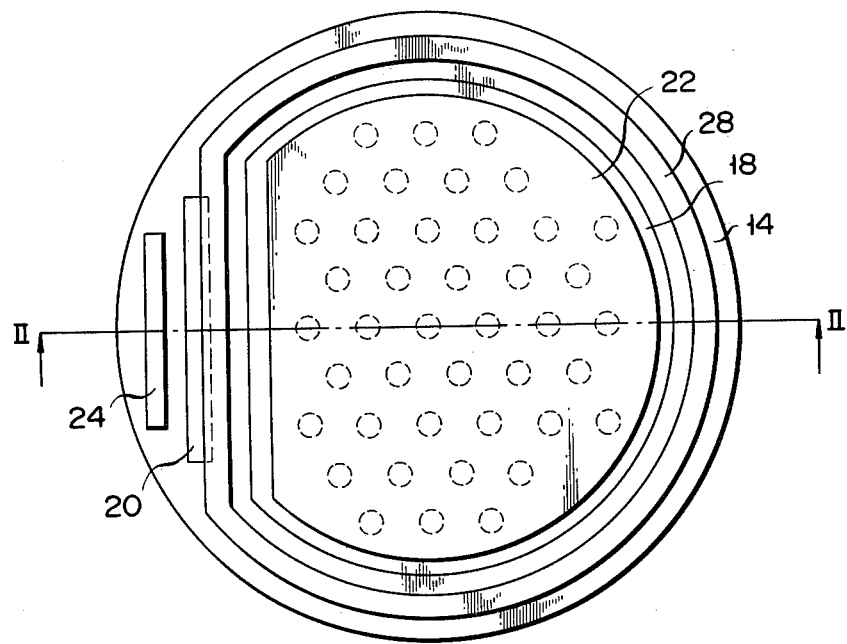
FIG. 1 is a plan view of a leading portion in a structure of a prior thyristor.
Figure 2:
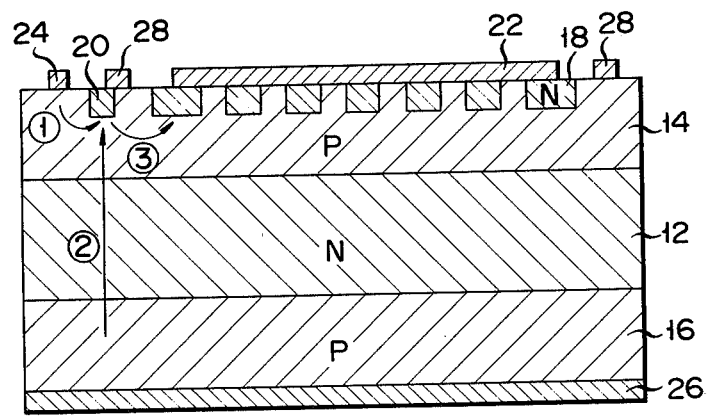
FIG. 2 is a cross sectional view taken on line II—II and as viewed in an arrow direction in FIG. 1.
Figure 3:
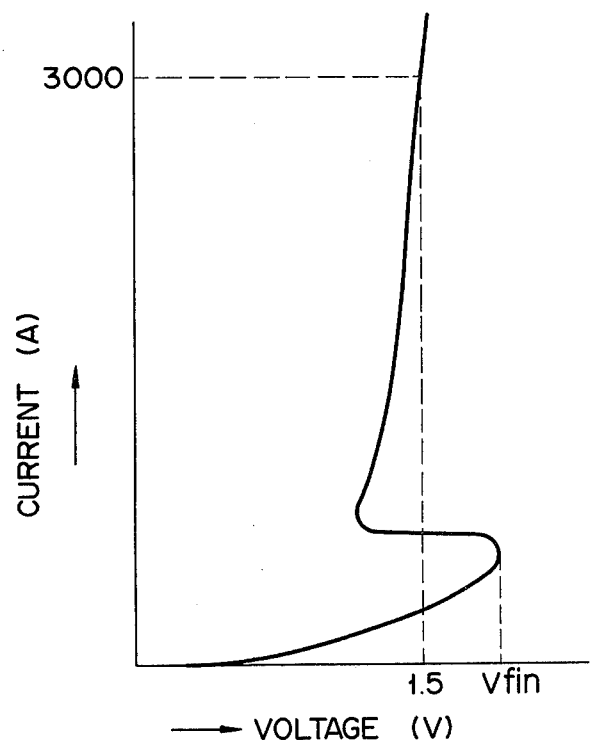
FIG. 3 is a voltage vs. current characteristic curve of the thyristor with a structure as shown in FIGS. 1 and 2.
Figure 4:
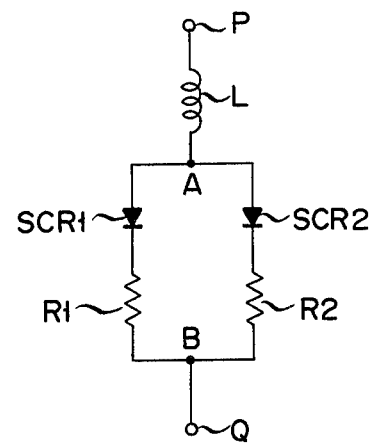
FIG. 4 is a circuit diagram of a model circuit having two parallel-connected thyristors having a structure as shown in FIGS. 1 and 2.

An embodiment of a semiconductor device according to the present invention will be described referring to FIGS. 5, 6 and 7. A first semiconductor layer 32 of N conductivity type, for example, is sandwiched at second and third semiconductor layers 34 and 36 of P conductivity type, contacting at the major surfaces with the latter layers. A main emitter region 38 of N conductivity type and an auxiliary emitter region 40 of the same conductivity type, which are continuous, are formed in the second semiconductor layer 34. Semiconductor layers 32, 34 and 36, and the semiconductor regions 38 and 40 cooperatively form a semiconductor body. A cathode electrode 42 is formed on the main emitter region 38. A gate electrode 44 is disposed on the second semiconductor layer 34, facing the cathode electrode 42 with the auxiliary region 40 interposed therebetween. The cathode electrode 42 is comprised of the first main portion $42_A$ and second portion $42_B$ extending from the first portion. Anode electrode 46 is layered on the lower surface of the third semiconductor layer 36.

On the P layer 34 and auxiliary emitter region 40 an auxiliary electrode 48 is disposed. The electrode 48 consists of two first portions $48_{A1}$, $48_{A2}$ and one second portion $48_B$ connected at its ends respectively to the first portions $48_{A1}$ and $48_{A2}$. The first portions $48_{A1}$, $48_{A2}$ are formed partly on the P layer 34 and partly on the auxiliary emitter region 40 and between the cathode electrode 42 and the gate electrode 44 and have their free ends spaced from each other. The second portion $48_B$ is formed on the P layer 34, and extending along the periphery of the cathode electrode 42 formed on the P layer 34.

Figure 5:
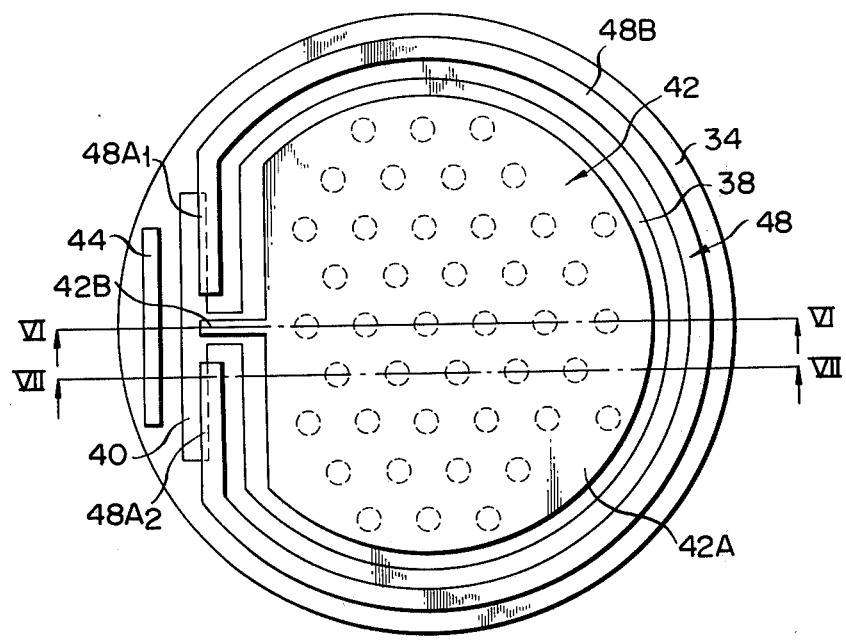
FIG. 5 is a plan view of an embodiment of a semiconductor device according to the present invention.
Figure 6:
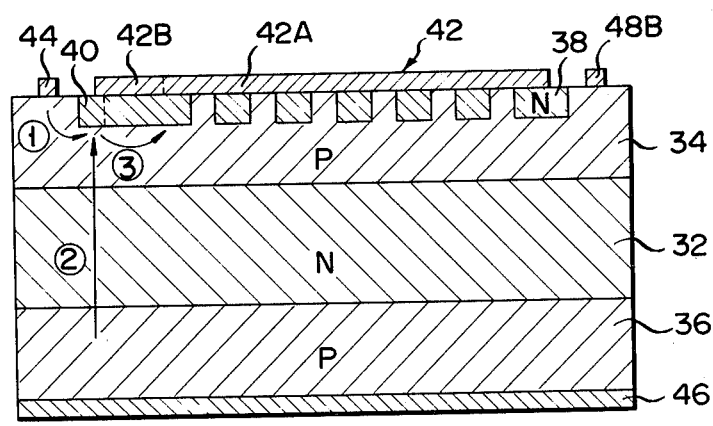
FIG. 6 is a cross sectional view taken on line VI—VI in FIG. 5 and as viewed in an arrow direction.
Figure 7:
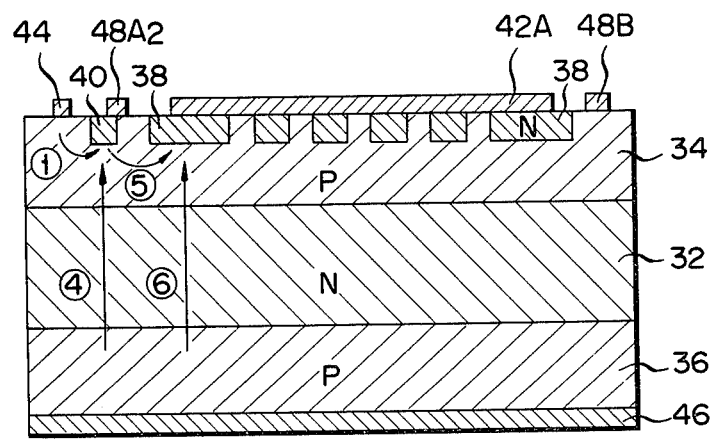
FIG. 7 is a cross sectional view taken on line VII—VII in FIG. 5 and as viewed in an arrow direction.

The thyristor of FIGS. 5, 6 and 7 differs from the prior art thyristor in that the cathode portion $42_B$ of the cathode electrode 42 lies between the free ends of the first portions $48_{A1}$ and $48_{A2}$ of the auxiliary electrode 48 and in face-to-face relation to the gate electrode 44. In other words, an essential point of the present embodiment resides in that a portion of the emitter section of the main thyristor element, i.e. a region defined by the cathode electrode 42, and an emitter section of the auxiliary thyristor element, i.e. regions defined by the portions $48_{A1}$ and $48_{A2}$ of the auxiliary electrode 48, are disposed in a region where a gate current flows into a path between the gate electrode 44 and the cathode electrode 42.

The operation of the semiconductor device as described above will be described. Description will first be given about the case where the thyristor is turned on in a state that a low voltage is applied between the anode and cathode of the thyristor. In this case, a gate current ① is fed to the thyristor by way of a gate electrode 44. In response to the gate current, that portion of the main thyristor element which is close to the gate electrode 44 is turned on and current ② starts to flow. The current ② then spreads from the portion of the main thyristor element toward the entire of the main thyristor element. As a result, the main thyristor is entirely turned on and current ③ flows into the entire main thyristor element. In this way, the thyristor shown in FIGS. 5 to 7 is turned on. Simultaneously, the supply of the gate current ① also turns on the auxiliary thyristor element, so that current ④ starts to flow into the auxiliary thyristor element. If the current ④ should shift to the main thyristor element at the time of the low voltage application, the problem of the prior art thyristor would arise. In the thyristor of the present embodiment, however, when a low voltage is applied, the current ④ never shifts to the main thyristor element for the following reason. In the semiconductor device of the amplification gate type, a lateral impedance between the main thyristor element and the auxiliary thyristor element is selected to be at a relatively large value in order to enhance the amplification gate function. Therefore, an insufficient potential difference is produced between the main and auxiliary thyristor elements at the time of the low voltage application, that is, when a potential difference between the anode and the cathode is small. Accordingly, the current ④ has an amplitude insufficient to turn on the main thyristor. The current, having flowed into the auxiliary thyristor element, flows through the second portion $42_B$ of the cathode electrode 42, and then spreads into the entire area of the main thyristor element, with the result that the potential at the emitter of the main thyristor element substantially drops. As a consequence, the current ⑤ flowing into the main thyristor element disappears (before it shifts to the main thyristor element).

Figure 8:
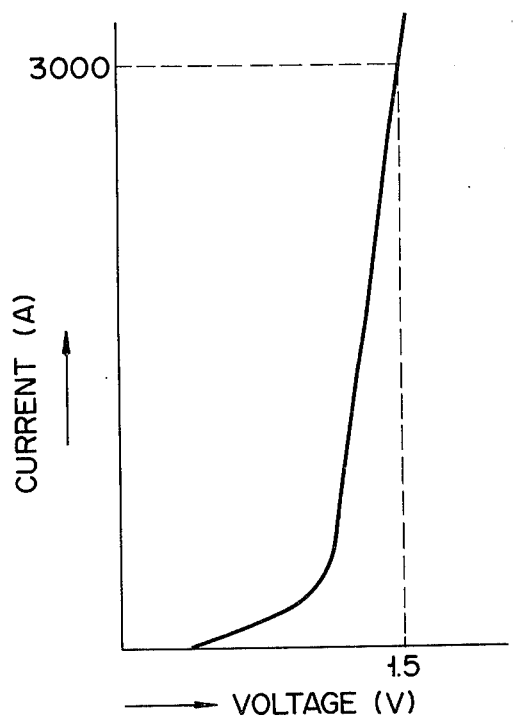
FIG. 8 is a graphical representation of a voltage-current characteristic curve of the semiconductor device shown in FIGS. 5, 6 and 7, which has no finger voltage phenomenon.

For this reason, the thyristor according to the present embodiment substantially eliminates the finger voltage phenomenon, as evident from the voltage-current characteristic curve of FIG. 8, and hence is free from the problem by the finger voltage phenomenon.

Now it will be described how the thyristor operates when it is turned on with a high voltage applied between its anode and its cathode. Also in this case, the main thyristor element is partially turned on by feeding the gate current ① into the thyristor, as in the case of the low voltage application. With the start of the flow of the current ②, the auxiliary thyristor element is also turned on and the current ④ flows into the auxiliary thyristor element. The current ④ flows as the current ⑤ into the main thyristor element, thereby turning on the whole main thyristor element. At this point, the thyristor shown in FIGS. 5 to 7 is turned on. As a result, the current ⑥ begins to flow into the whole main thyristor element. At this time, the potential of the auxiliary thyristor element abruptly falls off so that a high voltage of several hundred volts, for example, may be applied between the main and auxiliary thyristor elements, thereby quickly turning on the main thyristor element. The current ② flowing into the portion of the main thyristor will spread into the entire area of the main thyristor element, but the spreading of the current ② is slow, that is, a delay time $t_d$ (FIG. 9B) is long, because of small lateral resistance. Therefore, when the thyristor is turned on under the condition of the high voltage application, the current spreads from the auxiliary thyristor element to the main thyristor element, resulting in a large critical rate of rise of on-state current (di/dt).

As seen from the foregoing description, the present embodiment according to the present invention provides a thyristor which produces a negligible finger voltage phenomenon when the thyristor is turned on under the low voltage application condition and provides a high critical rate of rise of on-state current (di/dt) when the thyristor is turned on under the high voltage application condition.

According to an experiment conducted by the inventors in the present patent application, the thyristor of the present embodiment had: $V_{fin} \leq 1.5$ V and critical rate of rise of on-state current (di/dt) $\geq 350$ A/μs when voltage of 4,000 V is applied between the anode and the cathode. With such a structure of the thyristor of the present embodiment, an arrangement of two or more parallel-connected thyristors does not suffer from the problem of the prior art thyristor, and requires no series-connected resistors $R_1$ and $R_2$. Elimination of the resistors $R_1$ and $R_2$ eliminates the power loss by the resistors and the heat dissipation process, thereby realizing the miniaturization of the whole semiconductor device.

Figure 9A:
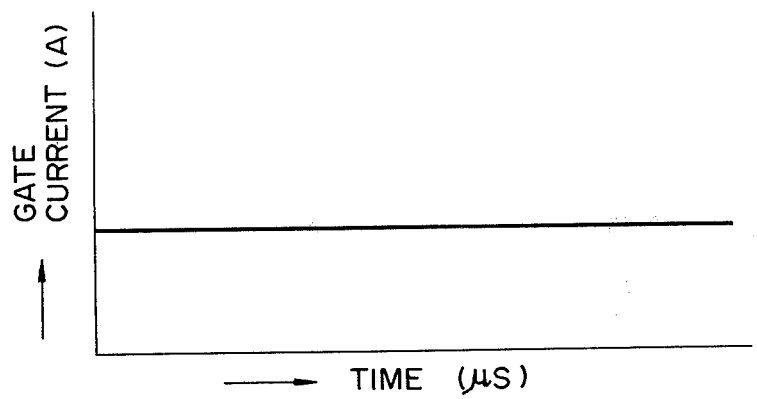
FIG. 9A is a graphical representation of a gate current of the thyristor.
Figure 9B:
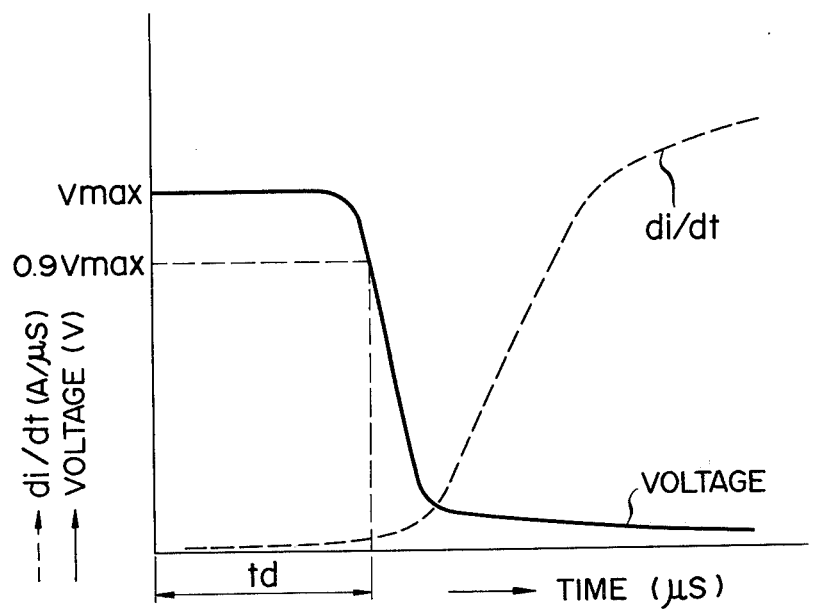
FIG. 9B is a graphical representation of variations of a voltage between the anode and the cathode and a critical rate of rise of on-state current (di/dt) at the time of the turn-on of the thyristor.

FIG. 9A plots a gate current which is constant with respect to time. FIG. 9B plots a voltage drop across the anode-cathode path and a critical rate of rise of on-state current (di/dt) with respect to time when the thyristor is turned on by the gate current of FIG. 9A under the low voltage application condition. The delay time $t_d$ is defined by a period from the time that the gate current is supplied to the time that the voltage drop falls by 10% of the maximum value $V_{max}$, that is, to 90% of the maximum value $V_{max}$.

Turning now to FIGS. 10 and 11, there are shown other embodiments of a semiconductor device according to the present invention. In the embodiments shown in FIGS. 10 and 11, like symbols are used to designate like or equivalent portions in FIGS. 5 to 7 for simplicity of explanation.

While, in the embodiment shown in FIGS. 5 to 7, the main emitter region 38 and the auxiliary emitter region 40 are continuously formed, those regions are separated from each other in the embodiment of FIG. 10. In this embodiment, the auxiliary emitter region is divided into two portions $40_{A1}$ and $40_{A2}$.

In the embodiment shown in FIG. 11, two portions $42_{B1}$ and $42_{B2}$ of the cathode electrode 42 lie between the free ends of the first portions $48_{A1}$ and $48_{A2}$ of the auxiliary electrode 48, while the cathode electrode 42 has one extending portion $42_B$ in the embodiment shown in FIGS. 5 to 7.

The embodiments shown in FIGS. 10 and 11 can attain effects similar to those achieved by the embodiment shown in FIGS. 5 to 7.

Although the present invention is applied for the thyristor in the embodiments shown in FIGS. 5 to 7, 10 and 11, the present invention is applicable for any semiconductor devices if those are of the so-called amplification gate type. The embodiment shown in FIGS. 5 to 7 employs the N conductivity type for the first semiconductor layer, but it can use the P conductivity type semiconductor in place of the N conductivity type one. In such a case, the conductivity type of the remaining semiconductor layers and regions must of course be changed to the opposite conductivity type.

In the embodiments of FIGS. 5, 10 and 11, the second portion of the cathode electrode 42 may not be necessarily provided. In the embodiment of FIG. 10, the second portion of the cathode electrode 42 may not be provided and the gate electrode 44 may comprise a first portion extending substantially along the first portions of the auxiliary electrode 48 and a second portion being formed between the two first portions of the auxiliary electrode 48. The second portion of the gate electrode 44 does not contact the first portions of the auxiliary electrode 48. The second portion of the gate electrode 44 also does not contact the cathode electrode 42.

It should be understood that the present invention may be changed, modified or altered within the scope of the appended claims.

What we claim is:

1. A semiconductor device comprising:
   a semiconductor body having a first semiconductor layer of a first conductivity type, second and third semiconductor layers of a second conductivity type formed contacting with both major surfaces of said first semiconductor layer, and first and second semiconductor regions of the first conductivity type formed in said second layer;
   a cathode electrode having first and second portions provided on said first region;
   a gate electrode provided on said second layer;
   an anode electrode provided on said third layer;
   an auxiliary electrode consisting of two first portions and one second portion connected at ends respectively to the first portions, said first portions being formed on said second region and having free ends spaced from each other, and said second portion formed on said second layer and extending along the periphery of the first portion of said cathode electrode; and
   said second portion of said cathode electrode and said first portions of said auxiliary electrode being disposed in an area between said gate electrode and said cathode electrode where a gate current flows.

2. A semiconductor device according to claim 1, wherein said gate electrode is provided in opposition to said cathode electrode with said first portions of said auxiliary electrode interposed therebetween, and said second portion of said cathode electrode lies between said free ends of the first portions of said auxiliary electrode.

3. A semiconductor device according to claim 1, wherein said first and second regions are continuously formed.

4. A semiconductor device according to claim 1, wherein said first and second regions are separated from each other.

5. A semiconductor device comprising:
a semiconductor body having a first semiconductor layer of a first conductivity type, second and third semiconductor layers of a second conductivity type formed contacting with both major surfaces of said first semiconductor layer, and first and second semiconductor regions of the first conductivity type formed in said second layer, said first semiconductor region having first and second portions;
a cathode electrode provided on said first portion of said first region;
a gate electrode provided on said second layer;
an anode electrode provided on said third layer;
an auxiliary electrode consisting of two first portions and one second portion connected at ends respectively to the first portions, said first portions being formed on said second region and having free ends spaced from each other, and said second portion formed on said second layer and extending along the periphery of said cathode electrode; and
said second portion of said first region and said first portions of said auxiliary electrode being disposed in an area between said gate electrode and said cathode electrode where a gate current flows.

6. A semiconductor device according to claim 5, wherein said gate electrode is provided in opposition to said cathode electrode with said first portions of said auxiliary electrode interposed therebetween, and said second portion of said first region lies between said free ends of the first portions of said auxiliary electrode.

7. A semiconductor device according to claim 5, wherein said first and second regions are continuously formed.

8. A semiconductor device according to claim 5, wherein said first and second regions are separated from each other.

9. A semiconductor device comprising:
a semiconductor body having a first semiconductor layer of a first conductivity type, second and third semiconductor layers of a second conductivity type formed contacting with both major surfaces of said first semiconductor layer, and first and second semiconductor regions of the first conductivity type formed in said second layer;
a cathode electrode provided on said first region;
a gate electrode having first and second portions provided on said second layer;
an anode electrode provided on said third layer;
an auxiliary electrode consisting of two first portions and one second portion connected at ends respectively to the first portions, said first portions being formed on said second region and having free ends spaced from each other, and said second portion formed on said second layer and extending along the periphery of said cathode electrode; and
said first portion of said gate electrode extending substantially along said first portions of said auxiliary electrode, and said second portion of said gate electrode disposed in an area between said first portion of said gate electrode and said cathode electrode where a gate current flows.

10. A semiconductor device according to claim 9, wherein said first and second regions are separated from each other.

* * * * *